United States Patent [19]
Ravel et al.

[11] Patent Number: 5,412,330
[45] Date of Patent: May 2, 1995

[54] OPTICAL MODULE FOR AN OPTICALLY BASED MEASUREMENT SYSTEM

[75] Inventors: Mihir K. Ravel; Michael D. Jones; Steven H. Pepper, all of Portland, Oreg.

[73] Assignee: Tektronix, Inc., Wilsonville, Oreg.

[21] Appl. No.: 77,905

[22] Filed: Jun. 16, 1993

[51] Int. Cl.⁶ .................... G01R 31/308; G01R 31/02
[52] U.S. Cl. ...................................... 324/753; 324/96
[58] Field of Search ................ 324/158 R, 96, 158 F, 324/753

[56] References Cited

U.S. PATENT DOCUMENTS

| | | | |
|---|---|---|---|
| 4,434,399 | 2/1984 | Mourou et al. | 324/96 |
| 4,446,425 | 5/1984 | Valdmanis et al. | 324/96 |
| 4,618,819 | 10/1986 | Mourou et al. | 324/96 |
| 4,841,234 | 6/1989 | Aoshima et al. | 324/96 |
| 4,843,309 | 6/1989 | Kareem et al. | 324/121 R |
| 4,887,026 | 12/1989 | Takahashi et al. | 324/96 |
| 4,891,581 | 1/1990 | Takiguchi | 324/96 |

(List continued on next page.)

OTHER PUBLICATIONS

Shinagawa, Mitsuru and Nagatsuma, Tadao, "A Laser-Diode-Based Picosecond Electrooptic Prober for High-Speed LSI's", IEEE Transactions on *Instrumentation and Measurement,* vol. 41, No. 3, pp. 375–380, Jun. 1992.

Shinagawa, Mitsuru and Nagatsuma, Tadao, "An Automated Optical On-Wafer *Probing System for Ultra-High-Speed ICs,*" Paper 39.1, International Test Conference 1992, pp. 834–839, 1992.

Kamiya, Takeshi, "V. Ultrafast Optoelectronics and Their Application to IC Testing", Optoelectronics Technology Today, pp. 34–39, Anritsu Corp., Tokyo, 1991.

Aoshima, Shinichiro; Takahashi, Hironori; Hirano, Isuke; and Tsuchiya, Yutaka, "Improvement of the Minimum Detectability of Electro-Optic Sampling by Using a Structurally New Probe," OSA Proceedings on Picosecond Electronics and Optoelectronics, vol. 9, paper FB4, pp. 174–177, 1991.

Takahashi, H.; Aoshima, S.; and Tsuchiya, Y., "Improvement of Space Dependent Sensitivity and Absolute Voltage Measurement in Non-Contact Picosecond Electro-Optic Sampling," *OSA Proceedings on Picosec-*
(List continued on next page.)

*Primary Examiner*—Ernest F. Karlsen
*Attorney, Agent, or Firm*—John D. Winkelman; James W. Jandacek

[57] ABSTRACT

An optical module for an optically based measurement system, such as an electro-optic system (10) for measuring electrical characteristics of a device under test (14), has a probe arm (26), a layer of electro-optic material (27), and a first optical system for delivering a measurement beam (44) to the layer and for producing therefrom an information-carrying beam having optical characteristics indicative of the electric characteristics. The first optical system includes a first lens (128), and (optional) polarization bias adjustment (130), a dichroic beamsplitter (112), and a second lens (114). The module also has a second optical system for delivering an observation beam (66) through the layer and onto a portion (68) of the device and for forming from rays (69) stemming from the observation beam a light pattern (70) indicative of the portion. The information-carrying beam is analyzed in a polarization analysis module into component beams (136, 138) in respective linearly independent polarization states. Converters (144, 146) produce electrical signals (147, 148) indicative of the intensity of the respective component beams; alternatively, the component beams are conveyed for analysis elsewhere. Connections (46, 65, 74, 149, 150) to and from the components fixedly mounted relative to the probe arm are flexible, allowing the probe arm and the components to move freely in any direction relative to the device under test.

24 Claims, 7 Drawing Sheets

U.S. PATENT DOCUMENTS

| | | |
|---|---|---|
| 4,906,922 | 3/1990 | Takahashi et al. ............ 324/158 R |
| 5,034,683 | 7/1991 | Takahashi et al. ............ 324/158 R |
| 5,057,771 | 10/1991 | Pepper ........................... 324/158 R |
| 5,072,140 | 12/1991 | Pepper et al. ..................... 307/510 |
| 5,274,325 | 12/1993 | Shinagawa et al. ............ 324/158 R |

OTHER PUBLICATIONS

*ond Electronics and Optoelectronics,* vol. 9, Paper FB5, pp. 178–191, 1991.

Frankel, Michael Y; Whitaker, John F.; Mourou, Gerard A.; and Valdmanis, Janis A., *"Experimental Characterization of External Electrooptic Probes", IEEE Microwave and Guided Wave Letters,* vol. 1, No. 3, pp. 60–62, 1991.

Nagatsuma, T.; Shibata, T.; Sano, E.; and Iwata, A., "Non–Contact Electrooptic Sampling System in Sub–picosecond Regime," *IEEE Instrumentation Measurement Technology Conference,* pp. 152–158, Feb. 1990.

Novellino, John, "Electro–Optic Device Tester Tops 1–Ghz", *Electronic Design,* pp. 55, 57–58, Sep. 8, 1988.

Henley, Francois J., "Electro–Optic Technology Supports Gigahertz Test Speeds," Electronics Test, pp. 33–34, 36, Sep. 1988.

Weingarten, Kurt J., Dissertation, *Gallium Arsenide Integrated Circuit Testing Using Electrooptic Sampling,* Edward L. Ginzton Laboratory of the W. W. Hansen Laboratories of Physics, Stanford University, Dec. 1987.

Kolner, Brian H. and Bloom, David M., "Electrooptic Sampling in GaAs Integrated Circuits," *IEEE Journal of Quantum Electronics,* vol. QE–22, No. 1, pp. 79–93, Jan. 1986.

Valdmanis, Janis A., and Mourou, G., "Subpicosecond Electrooptic Sampling: Principles and Applications," *IEEE Journal of Quantum Electronics,* vol. QE–22 No. 1, pp. 69–78, Jan. 1986.

Valdmanis, Janis A.; Mourou, Gerard A.; and Gabel, C. W., "Subpicosecond Electrical Sampling," *IEEE Journal of Quantum Electronics,* vol. QE–19, No. 4, pp. 664–667, Apr. 1983.

OPTICAL MODULE FOR AN OPTICALLY BASED MEASUREMENT SYSTEM

TECHNICAL FIELD

The present invention pertains to optically based measurement systems for measuring characteristics (such as electrical characteristics) of a device under test.

BACKGROUND OF THE INVENTION

Optically based systems for measuring a characteristic of a device under test use a material to affect optical characteristics of a light beam directed onto, into, or through the material. The material affects the optical characteristics of the beam because its index of refraction changes in response to changes in the characteristic. That change in the index of refraction causes a phase change in light passing through and/or reflection from the material; the phase change can be measured by detecting a change in the polarization state of the light.

One example of such an optically based system is an electro-optic measurement system. In an electro-optic measurement system the electro-optic material is brought close to the device under test; for some devices under test (e.g., those made of gallium arsenide (GaAs)) the device under test has electro-optic properties and can serve as the electro-optic material. Electric fields stemming from electrical effects in the device under test (and thus representative of the electrical characteristics) change the optical properties of the electro-optic material. The electro-optic material is illuminated with a measurement beam, and a beam is produced having optical characteristics affected by the electro-optic material. The affected optical characteristics of the beam are then detected and converted into an electrical signal representing the electric fields near or in the electro-optic material and thus also representing the electrical characteristics of the device under test.

Electro-optic measurement systems require precise control of the position of the electro-optic material relative to the device under test. They also require precise control of the position and alignment of the optical components associated with the measurement beam. Most work in electro-optic measurement systems has addressed those issues in a research context in which the device under test and/or the optical components associated with the measurement beam may be fixed in position for a considerable time.

In engineering or manufacturing environments it is often desirable or necessary to test electrical characteristics of a large number of devices in a time determined by economic considerations. Presently-existing electrical contact test systems for such environments provide for the rapid movement of devices to be tested through test stations. The test stations are equipped with probe arms used for two types of purposes: to apply an electrical signal to the device under test, and to carry an electrical probe for making electrical contact with a part of the device under test at which an electrical characteristic (a voltage or a current) is to be measured.

There is a need to bring the usefulness of electro-optic measurement systems into engineering or manufacturing environments. Electro-optic measurement systems offer a variety of important advantages over electrical contact test systems, Electrical contact with a device under test alters the electrical characteristics to be measured, This limits the usefulness of electrical contact systems for measuring small voltages and currents and high frequencies, Electro-optic measurement systems do not rely on electrical contact with the device under test, They offer a high bandwidth and can measure high-speed electrical characteristics such as those occurring in a time of the order of femtoseconds or with a frequency of the order of terahertz, Electro-optic measurement systems developed in a research context present many problems which impede their adaptation for engineering or manufacturing environments, Engineering or manufacturing environments impose much greater demands for movement of the electro-optic layer relative to the device under test, Engineering environments usually must test a variety of different types of devices under test, Manufacturing environments normally must test a high volume of a single type of product and often must test more than one different type of product, In such environments the electro-optic layer must be readily and rapidly moveable with respect to the stage that holds the device under test, In such environment an electro-optic system should offer frequent three-dimensional movement of the electro-optic material relative to the device under test over a distance of the order of one centimeter, A typical operating separation between the electro-optic material and the device under test is one to five micrometers, The combination of centimeter-order movement and micrometer-order separation creates a likelihood that a user will damage the electro-optic material by contact with the device under test many times during the economic life of the electro-optic system.

Electro-optic measurement systems developed for use in a research context typically require a micropos60itioner to replace damaged electro-optic material with new, undamaged material. However, engineering and manufacturing environments typically lack the equipment, the skills in optics, and/or the time to carry out such replacement procedures. The process of realigning the optical elements is time-consuming even for a person trained in optics; it is difficult for a person not trained in optics. Typically persons who operate test systems in an engineering or manufacturing environment are not trained in optics. Moreover, damage to the electro-optic material necessitating replacing it may occur much more often in an engineering or manufacturing environment than in a research environment., Thus, an electro-optic system for use in an engineering or manufacturing environment must allow easy replacement of the electro-optic material by a user. Moreover, alignment of the optical components associated with the measurement beam is important for reliable operation of an electro-optic measurement system but can require considerable time and expertise. Thus, replacement of the electro-optic material should not necessitate realignment of those components.

Engineering and/or manufacturing environments also impose much greater demands for movement of the electro-optic layer relative to the device under test. Engineering environments normally must test a variety of different types of devices under test. Manufacturing environments normally must test a high volume of a single type of product and often must test more than one different type of product. In such environments the electro-optic layer must be readily and rapidly moveable with respect to a test stage that holds the device under test. Electro-optic measurement systems developed for use in a research context are not required to, and do not, have the ability provide such movement because their optical elements readily lose alignment as a result of such movement. The process of realigning the optical elements is time-consuming even for a person trained in optics; it is difficult for a person not trained in optics. Typically, persons who operate an electro-optic measurement system in an engineering or manufacturing environment are not trained in optics. Thus, an electro-optic measurement system should be able to carry out the types of movement demanded in engineering and manufacturing environments without requiring realignment of its optical systems. Moreover, the electro-optic layer must be small and readily moveable to locations near relatively complex devices under test (e.g., around raised structures or between electrical leads in integrated circuits or hybrid circuit devices). Most electro-optic systems developed for use in a research environment use microscope objectives, which are too large or cumbersome in relation to the device under test to be insertable as required.

The electro-optic systems developed in research environments do not have the required features. There is accordingly a need for an electro-optic system that does have them.

SUMMARY OF THE INVENTION

Accordingly, one object of the invention is to provide an electro-optic measurement system in which the optical components do not need to be realigned after replacing a damaged layer of electro-optic material or carrying out the types of movements required in engineering and/or manufacturing environments.

Another object of the invention is to provide an electro-optic measurement system that can readily perform the types of movements relative to a device under test that are required in engineering and/or manufacturing environments.

The invention meets the foregoing needs, and satisfies the foregoing objects, by providing for an optically based measurement system such as is more fully described in U.S. patent application Ser. No. 08/078,101 for an OPTICALLY BASED MEASUREMENT SYSTEM ("measurement system application") an optical module including a probe tip mount such as is more fully described in U.S. patent application Ser. No. 08/078,102 for an EASILY REPLACEABLE PROBE TIP MOUNT FOR AN OPTICALLY BASED MEASUREMENT SYSTEM AND METHODS OF MAKING IT ("probe tip mount application"). Each of the measurement system application and the probe tip mount application is filed concurrently herewith and assigned to the assignee of the present application. The optically based measurement system is preferably an electro-optic measurement system used for measurement of electrical characteristics of a device under test; it employs a measurement beam and an observation beam and provides for movement of the probe arm in any direction relative to the device under test.

The module includes a measurement system operative to receive the measurement beam and to produce therefrom an information-carrying beam indicative of electrical characteristics of the device under test and measurement optics operative to receive the information-carrying beam and to produce therefrom a measurement signal indicative of the electrical characteristics of the device under test. The measurement system and the measurement optics are fixedly connected relative to each other during normal operation of the electro-optic system so that relative movement of the measurement system and the device under test does not affect the alignment of the optical components contained in each system. The electro-optic system may also include an observation system operative to produce a light pattern such as an optical image containing information representative of a portion of the device under test.

In preferred embodiments the measurement system, the measurement optics, the observation system, and the observation optics are fixedly connected relative to one another during normal operation of the device so that movement of the electro-optic layer does not change the optical paths within either the measurement system and optics or the observation system and optics.

The measurement system and optics and the observation system and optics are each fixedly connected relative to a mechanically rigid probe arm. Movement of the probe arm necessarily moves the items fixedly connected to it. Connections to components not fixedly connected relative to the probe arm are by flexible connections for bringing signals to, and taking signals from, components fixedly connected relative to the probe arm. The flexible connectors may be of the optical or electrical type.

The measurement system provides the polarized measurement beam to the electro-optic layer. This may be accomplished by providing the measurement beam to the measurement system through a polarization-stripping flexible optical fiber and by adjusting the polarization state of the measurement beam to achieve the proper polarization bias. That adjustment is accomplished with a waveplate and by selecting an appropriate thickness for the electro-optic layer.

The measurement system optics also includes a beamsplitter operative to split the information-carrying beam into first and second component beams in linearly independent (as an example, orthogonal) polarization states and optical-to-electrical converters operative to produce from the component beams respective electrical signals indicative of the intensity of the component beams. The beamsplitter is fixedly connected relative to the measurement optics. In a first preferred embodiment the component beams are converted into electrical signals in separate optical-to-electric converters fixedly mounted relative to other optical components affecting the measurement beam. The electrical signals are then conveyed by flexible electrical connectors to a measurement signal acquisition unit not fixedly connected relative to the optical components that affect the measurement beam. In a second preferred embodiment the component beams are conveyed by flexible optical connectors to optical-to-electrical converters not fixedly connected relative to the optical components that affect the measurement beam. The electrical signals produced by the converters are then conveyed to a measurement signal acquisition unit.

The fixed mounting of the measurement and observation optics provided by the invention has several advantages over electro-optic measurement systems designed for use in research environments.

First, a user need position only a single assembly including the measurement and observation systems and optics. No difficult, unfamiliar optical adjustments are necessary. The rigid, unchangeable alignment of the optical elements allows "designed in" compensation and correction. Optical components associated with the measurement and information-carrying beams remain aligned even as the probe arm executes frequent and possibly large-scale movements. In contrast, the variable-position optical systems typical of those developed for use in a research environment are not compensatable for all possible beam positions.

Second, the device under test need not move. This allows a user in an engineering or manufacturing environment to continue to use mounting tables and stimulus delivery probe contacts that are in use with existing electrical contact measurement systems and to install a monolithic probe arm according to the invention to add the capability for electro-optic measurement. This makes a monolithic probe arm according to the invention compatible with standard electrical probe stations.

Third, a module according to the invention has greatly reduced sensitivity to vibration and to temperature changes. The fixed mounting of key optical components relative to each other (and preferably also relative to a probe arm) reduces the problem of managing vibrational effects to one of controlling such effects within the fixed components (or within the system of components fixedly mounted relative to the probe arm) and between the fixed components and the device under test. Such vibrational effects are easier to control and to reduce than vibrational effects that occur when key optical components are not fixed relative to each other. In a module according to the invention, vibration of the probe arm does not deflect the measurement beam from the electro-optic layer or cause the information-carrying beam to return from the probe tip misaligned with the polarization detection module. The same advantages exist with respect to the effects of temperature changes when key optical components are fixedly mounted relative to the probe arm. The probe arm experiences reduced temperature gradients, and key optical components share a common thermal sink and mechanical backbone.

Fourth, the monolithic probe arm according to the invention has considerable optical advantages over electro-optic systems in which the measurement beam is scanned to avoid having to move key optical components. Since the whole probe assembly according to the invention moves and the measurement beam is fixed (not scanned with respect to the objective lens) the entire objective lens aperture may be used. This permits a smaller focused spot (higher measurement resolution) to be obtained with a given numerical aperture objective.

Fifth, as discussed in the probe tip mount application, a damaged layer of electro-optic material may easily be replaced by carrying out a simple procedure that does not require complicated optical alignments.

Finally, the probe tip mount can be manufactured so that the probe tip is small enough to facilitate easy insertion near areas where electrical characteristics of the device under test are to be measured.

DETAILED DESCRIPTION OF PREFERRED EMBODIMENTS

Figure 1:
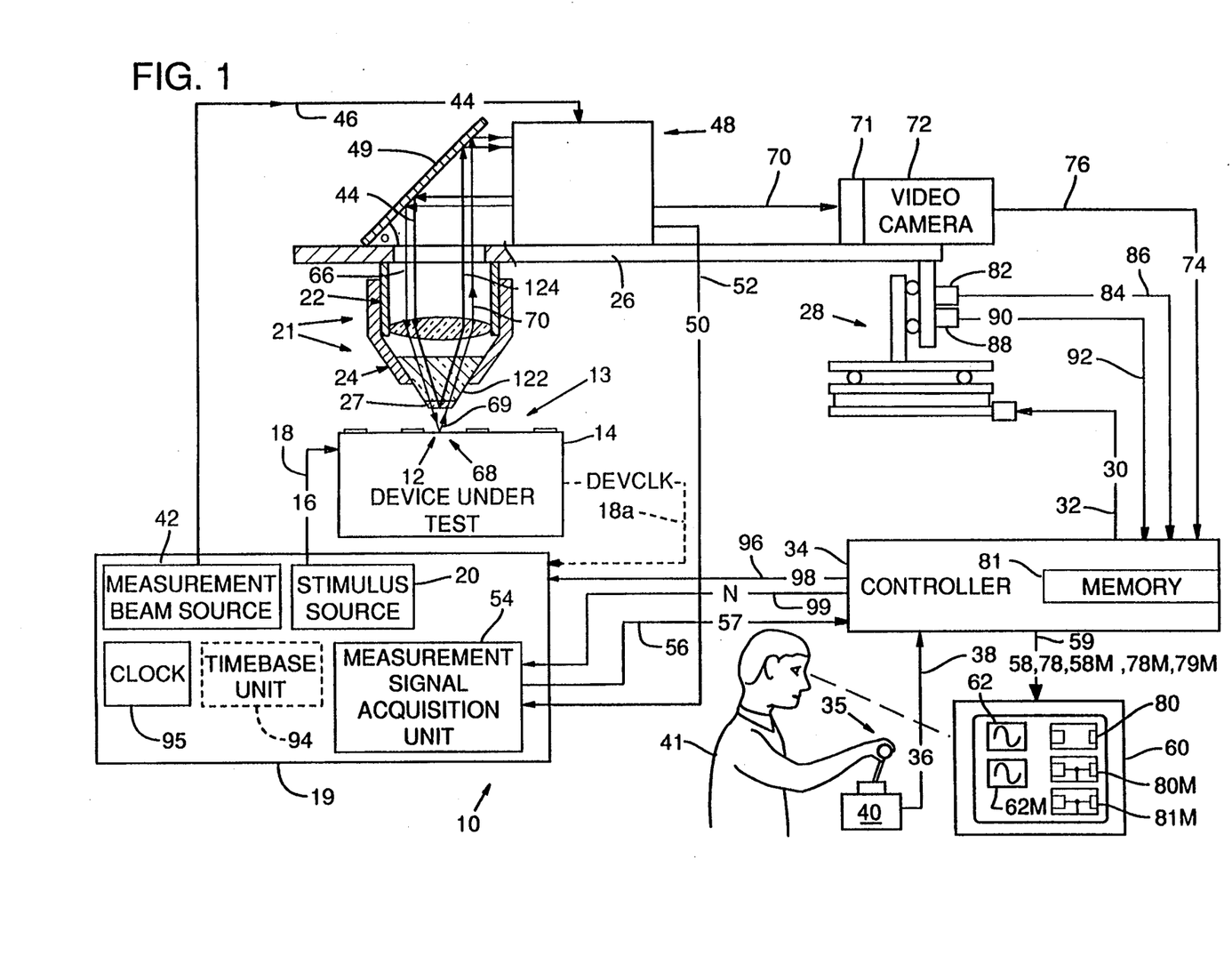
FIG. 1 is a partly schematic view of an electro-optic measurement system including a module according to the invention.

FIG. 1 shows relevant parts of one embodiment of an electro-optic system 10 for measuring electrical characteristics of a selected region 12 (e.g., of a surface 13) of a device under test 14 (e.g., an integrated circuit or hybrid circuit such as an electronic logic or memory device). Other aspects and embodiments of system 10 are described in the measurement system application and the probe tip mount application.

Device 14 is subjected to a stimulus 16 (e.g., an electrical stimulus such as a test signal) conveyed over a stimulus path or electrical probe contact 18 from a stimulus source or electrical signal generator 20. FIG. 1 shows stimulus source 20 as part of a signal and synchronization unit 19. However, stimulus source 20 may be located on device 14; one example is a clock or other signal source located on device 14 and running under power supplied to device 14 through contact 18. In such a case a device clock signal DEVCLK is fed over line 18A from device 14 to signal and synchronization unit 19 and used as the signal CLK (see FIGS. 7–10 of the measurement system application) in place of a signal from a clock 95 located physically separate from device 14.

In the embodiments shown herein stimulus 16 affects electrical characteristics of device 14; the purpose of system 10 is to determine electrical characteristics that exist in or near region 12 in response to stimulus 16. System 10 detects electrical characteristics in or near region 12 by sensing electric fields produced as a result of the application to device 14 of stimulus 16. System 10 does this as close to region 12 and device 14 as is practicable, ideally without significantly affecting the electrical characteristics to be measured, such as at a separation of 1–5 micrometers between region 12 and a layer 27. Although system 10 is intended to be operable without physical contact with device 14 near region 12, in principle the system may be operable with such contact.

System 10 includes a lens and probe assembly 21 including a lens mount 22 and a probe tip mount 24 supported by a mechanically rigid mounting structure or probe arm 26. Lens mount 22 and probe tip mount 24 have transparent interiors (preferably hollow, except where they support components described below).

Probe tip mount 24 supports at one of its ends a layer 27 of an electro-optical material such as gallium arsenide (GaAs), lithium tantalate (LiTaO$_3$), or lithium niobate (LiNbO$_3$). Gallium arsenide is preferable for applications measuring electrical characteristics because it exhibits a lower pyroelectric effect than lithium tantalate or lithium niobate, and therefore the effect of changes in temperature of layer 27 on the response of system 10 is less significant.

Arm 26 is supported and moved in any direction (as an example, in any or all of three linearly independent or orthogonal directions relative to device 14) by a probe positioner 28, which is in turn mounted on a support (not shown) which also holds device 14. Positioner 28 allows layer 27 to be moved to any location adjacent surface 13.

Positioner 28 is operative in response to a movement signal 30 conveyed over a movement signal path 32 from a controller 34 to move arm 26 relative to device 14. Controller 34 produces movement signal 30 in response to a command 36 conveyed to controller 34 over a command signal path 38 from a position indicator or joystick 40 operated by a user 41.

A measurement beam source or optical pulse generator or laser 42 generates a measurement beam or optical strobe signal 44 that is conveyed over a measurement beam path or flexible optical fiber 46 to measurement optics 48, which convey measurement beam 44 to beam turner or mirror 49 and thence through lens mount 22 and probe tip mount 24 to layer 27. Measurement beam path 46 is a polarization-stripping flexible optical fiber that passes a single polarization state (as an example, a linear polarization state) of measurement beam 44. Measurement beam path 40 could alternatively be a polarization-retaining optical fiber to which measurement beam 44 is provided in a single polarization state. Measurement beam source 42 also is part of signal and synchronization unit 19.

Layer 27 produces in response to measurement beam 44 an information-carrying beam 124 (see also FIG. 2) having optical characteristics indicative of electric fields sensed by layer 27 and thus of electrical characteristics of device 14. Information-carrying beam 124 passes through probe tip mount 24 and lens mount 22 to measurement optics 48, which in turn produces a measurement or electrical or optical signal 50 indicative of information in beam 124. Measurement signal 50 is conveyed over measurement signal path or flexible electrical or optical connector 52 to a measurement signal acquisition unit 54, which also is part of signal and synchronization unit 19. Measurement signal acquisition unit 54 provides to controller 34 over path 56 a signal 57 indicative of information contained in measurement signal 50 indicative of a characteristic of device 14 that is being measured. Controller 34 produces from the information received over path 56 a measurement display signal 58 indicative of information contained in measurement signal 50 and conveys it over a display signal path 59 to a display 60, which displays for viewing by user 41 a measurement signal display image or waveform 62 indicative of the information in measurement signal 50 and hence of electrical characteristics of region 12.

An observation beam source 64 (not shown in FIG. 1; see FIG. 2) produces an observation beam 66 (see also FIG. 2) that passes through lens mount 22, probe tip mount 24, and layer 27 to illuminate a portion 68 of surface 13; portion 68 typically includes region 12 but need not do so. Using rays 69 from illuminated portion 68, lens mount 22 and probe tip mount 24 form a light pattern or optical image 70 containing information representative of portion 68. Light pattern 70 impinges on a filter 71 (see also FIG. 2) fixedly mounted relative to probe arm 26 and preferably fixedly mounted at the input to observation optics or video camera 72, which is itself fixedly mounted on probe arm 26. Video camera 72 receives the output of filter 71 and produces from it an observation or video camera output signal 74 indicative of the light pattern. An observation signal or flexible electrical cable path 76 conveys observation signal 74 to controller 34, which produces therefrom an observation display signal 78 indicative of observation signal 74. Display 60 receives observation display signal 78 over display signal path 59 and produces therefrom for viewing by the user (not shown) a display image 80 indicative of the observation signal and thus also of the optical appearance of portion 68.

A position sensor 82 is attached to positioner 28 and produces a location or electrical signal 84 conveyed over location signal path or flexible electrical connector 86 to controller 34. A force sensor 88 is also attached to positioner 28 and produces a force signal 90 conveyed over force signal path 92 to controller 34. Location signal 84 is indicative of the location of arm 26 (and hence also of layer 27) relative to device 14; force signal 90 is indicative of forces produced in consequence of contact between probe tip mount 24 and/or layer 27 and device 14. Controller 34 preferably uses location signal 84 in producing observation display signal 78 and force signal 90 in producing movement signal 30.

Controller 34 has a memory 81 containing information, described in greater detail in the measurement system application, concerning device 14. Controller 34 determines the location of layer 27 relative to device 14 by using location signal 84 and appropriate initial information concerning an initial location (not shown) of layer 27. As described in greater detail in the measurement system application, controller 34 uses information in memory 81 to generate signals 58M, 78M, and 79M, which feed over line 59 to display 60, where they produce respectively display images of a predicted voltage or current waveform as predicted response 62M, a location of layer 27 relative to an electrical schematic as schematic location 80M, and a location of layer 27 relative to a physical representation of device 14 as physical representation location 81M.

Signal and synchronization unit 19 includes components for synchronizing and for controlling the relative phase and frequency of stimulus 16 and measurement beam 44. Those components include an (optional) timebase unit 94 and a clock 9. Signal and synchronization unit 19 is operative to receive from controller 34 over timebase signal path 96 a controller signal or phase control signal 98 indicative of a desired relationship between the frequency and phase of stimulus 16 and the frequency and phase of measurement beam 44 and over signal path 99 a signal N described in connection with FIGS. 12–14 of the measurement system application. As described in connection with FIGS. 7–10 of that application, signal and synchronization unit 19 is operative so that stimulus source 20 produces stimulus 16, and optical pulse generator 42 produces measurement beam 44, in a known relative repetition frequency and phase relationship controlled by phase control signal 98.

Signal and synchronization unit 19 also captures repetitive or periodic measurement signal 50 in a predetermined repetition frequency and phase relationship with measurement beam 44. In the preferred embodiments measurement signal acquisition unit 54 captures measurement signal 50 synchronously with measurement beam 44.

Stimulus source 20, measurement beam source 42, and measurement signal acquisition unit 54 operate synchronously with each other to produce measurement beam 44 and stimulus 16 and to capture measurement signal 50, respectively. Clock 95 supplies a clock signal to regulate that synchronous operation. Clock 95 may be external to those units and to timebase unit 94, or it may be contained in any of them. Timebase unit 94 regulates the frequency and phase relationship between stimulus 16 and measurement beam 44 (and thus also the frequency and phase of signal capture performed by measurement and signal acquisition unit 54) under control of phase signal 98. Timebase unit 94 may be external to each of stimulus source 20, measurement beam source 42, and measurement signal acquisition unit 54 or internal to any of them.

Phase control signal 98 is asynchronous to each of stimulus 16 and measurement beam 44; it instructs synchronization and control unit 19 to adjust the relative frequency and/or phase of stimulus 16 and measurement beam 44. Thus, controller 34 need not have access to clock 95 to issue phase control signal 98. However, controller 34 need not be physically separate from synchronization and control unit 19 or any of its components.

Figure 2:
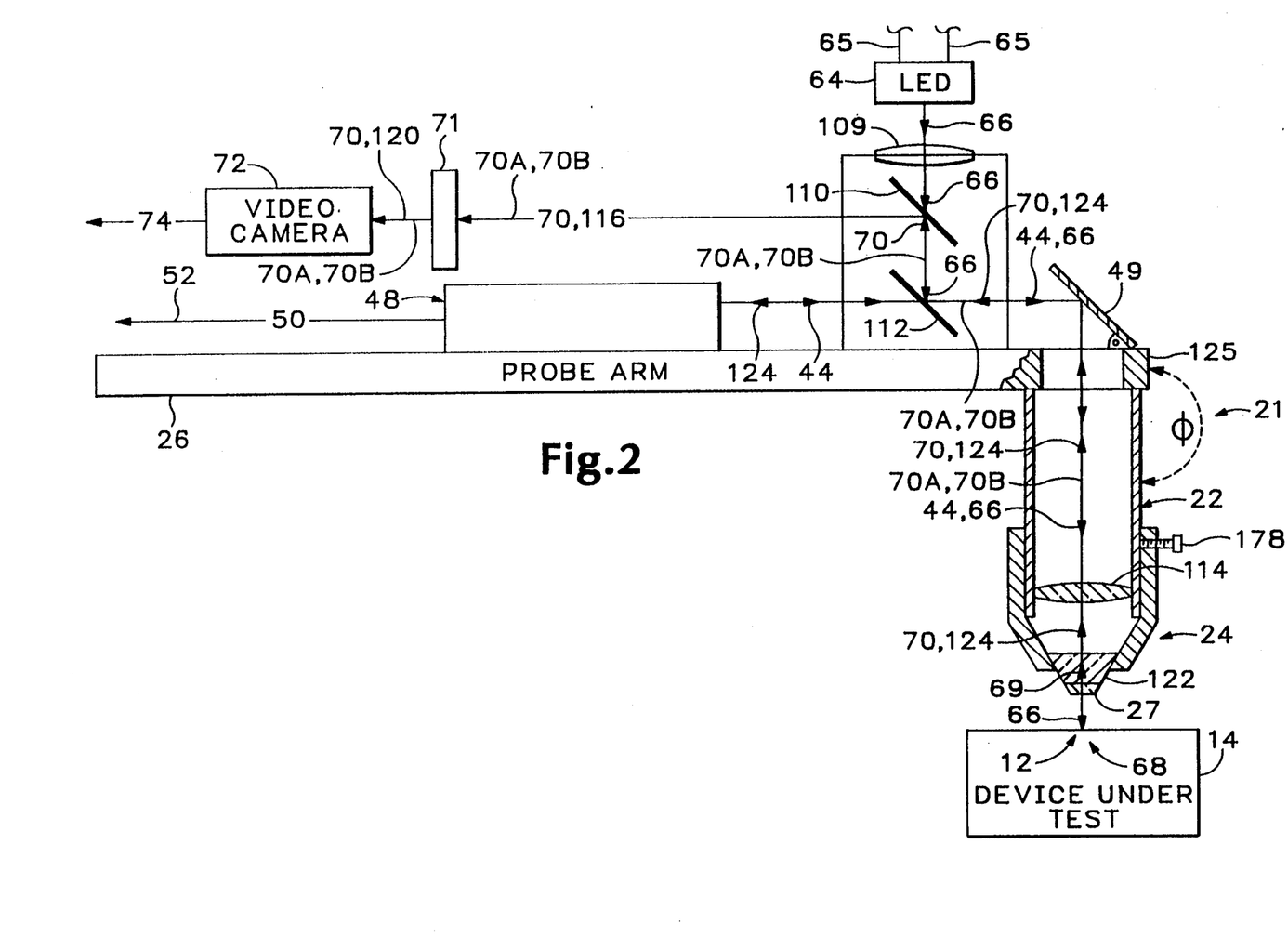
FIG. 2 is a partly schematic side view of part of the electro-optic measurement system of FIG. 1, showing certain items omitted from FIG. 1 for clarity.

FIG. 2 is a partly schematic side view of part of system 10 of FIG. 1, showing certain items omitted from FIG. 1 for clarity. An observation beam source or light-emitting diode 64 powered through power connection or flexible electrical connector 65 produces observation beam 66, which preferably lies in a range of wavelengths that does not include the wavelength of measurement beam 44. Observation beam 66 passes through a simple collimating lens 109, passes through a beamsplitter 110 such as a 50—50 beamsplitter, is turned at a beam combiner 112 such as a dichroic mirror operative to reflect beams in the wavelength range of observation beam 66 but to transmit all but a fraction of measurement beam 44, is turned at beam turner 49, and passes into lens mount 22. Lens mount 22 supports a beam direction unit or lens 114 operative to focus observation beam 66; observation beam 66 preferably fills the aperture of lens 114. At least part of observation beam 66 passes through layer 27 and its reflective coating 156 (FIG. 4) and illuminates portion 68.

Lens 114 receives from portion 68 through layer 27 rays 69 (see also FIG. 4) stemming from observation beam 66 and forms light pattern 70, which is turned at beam turner 49, turned at beam combiner 112, and split by beamsplitter 110 into a beam 116 directed toward observation optics 72 and another beam (which may be disregarded and is not shown) directed toward observation beam source 64. Beam 116 thus includes a portion of light pattern 70. Beam 116 passes through a filter 71 (which may include more than one filter) that attenuates components at the frequency of measurement beam 44 to a degree described below and blocks or severely attenuates any components at the frequencies of ambient light. The remaining portion of beam 116 is received as beam 120 by observation optics 72. Beam 120 thus also includes a portion of light pattern 70. Observation optics 72 produces from that portion observation signal 74. Thus, lens 114 produces at video camera 72 an image of either layer 27 or portion 68 of device under test 14. Additional focusing elements (not shown) may be used with video camera 76 to permit it to view device under test 14 through layer 27 before layer 27 is brought close to surface 13 of device under test 14. Light pattern 70 thus traverses a light pattern path segment 70A from lens 114 to observation optics 72 and has a light pattern path segment location 70B relative to them.

Measurement beam 44 also impinges on beam combiner 112 and passes it substantially collinearly with observation beam 66. Measurement beam 44 then impinges on beam turner 49, passes into lens mount 22, passes through lens 114, and is directed through a layer of support material 122 (see also FIG. 4) onto layer 27. A fraction of measurement beam 44 is lost at beam combiner 112; that fraction is disregarded herein. Lens 114 focuses beam 44 into a small spot on layer 27, preferably close to the center of layer 27. Layer 27 produces from measurement beam 44 an information-carrying beam 124 having optical characteristics affected by the electro-optic properties of layer 27. Information-carrying beam 124 passes through layer 122, passes through lens 114, and impinges on beam turner 49. All but a fraction of information-carrying beam 124 passes through beam combiner 112 and is received by measurement optics 48, which produces therefrom measurement signal 50.

The fraction of information-carrying beam 124 that does not pass through beam combiner 112 is reflected by that component to travel substantially collinearly with light pattern 70 to beamsplitter 110, which splits that fraction into one portion directed toward observation optics 72 substantially collinearly with beam 116 and another portion (which may be disregarded and is not shown) directed toward observation beam source 64. The fraction directed toward observation optics 72 impinges on filter 71; a further fraction passes through filter 71 and reaches observation optics 72.

Figure 4:
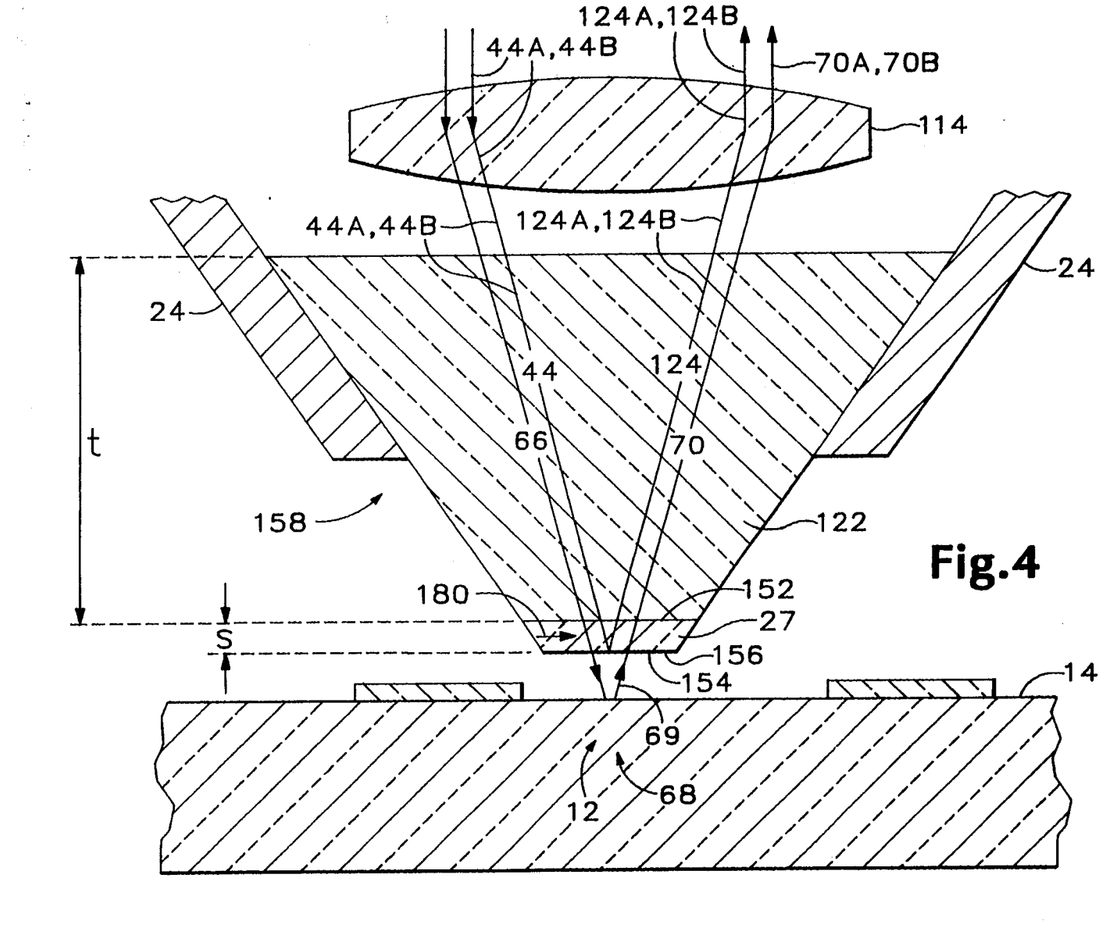
FIG. 4 is a partly schematic, simplified cross-sectional view of certain components of the electro-optic measurement system of FIG. 1, showing the path of measurement and observation beams through the lens mounted in the lens mount and through the probe tip.

Filter 71, beam combiner 112, and beamsplitter 110 are selected so that they have the combined effect of furnishing to video camera 72 a beam derived from information-carrying beam 124 that has an intensity (a) sufficient to permit video camera 72 to form an image of the spot where measurement beam 44 impinges on layer 27 and reflective coating 156 (FIG. 4) and to show that location on display image 80 but (b) insufficient to overwhelm the response of video camera 72 so as to wash or white out the image of portion 68. As a result, user 41 sees in display image 80 an image of portion 68 with a spot at a location in display image 80 corresponding to the point just below the point at which measurement beam 44 strikes layer 27 and reflective coating 156 (FIG. 4).

Measurement beam 44 has a wavelength range outside the wavelength range of observation beam 66 to facilitate the use of beam combiner 112, beamsplitter 110, and filter 71 to perform the function just described. Without such filtering, components in beam 116 derived from measurement beam 44 could dominate the response of observation optics 72 and prevent it from producing an observation signal 74 containing information accurately indicative of portion 68. For similar reasons, observation beam 66 has a wavelength range outside the wavelength ranges of ambient light present in areas in which system 10 is used. Observation beam 66 also has a wavelength range and an intensity that together do not affect the electrical characteristics of device 14 that are to be measured.

In one implementation measurement beam source 42 includes a diode-pumped YLF (yttrium-lanthanum-fluoride) modelocked laser producing an output beam at approximately 1047 nanometers with an average power of 100 milliwatts; observation beam source 64 is a Hitachi HE-8811 light-emitting diode producing an output with a peak emission at approximately 820 nanometers, a full-width-half maximum ("FWHM") emission spectrum of approximately 50 nanometers, and an average power of approximately 30 milliwatts; video camera 72 is responsive to wavelengths of the measurement and observation beams, such as a video camera including a silicon charge-coupled device (CCD) responsive to wavelengths up to 1100 nanometers, and is compact enough to fit on probe arm 26 (such as a Panasonic model GP-MS112); filters 71, 140, and 142 are Schott RG-715 glass with a thickness of 2 millimeters; and the average power at converters 144 and 146 of beams 136 and 138 is approximately 2 milliwatts each.

The optical components that affect measurement beam 44 and information-carrying beam 124 (measurement optics 48, beam combiner 112, beam turner 49, lens 114, layer 122, and layer 27) are fixedly connected relative to each other during normal operation of system 10. As a result, movement of any of them with arm 26 does not affect the optical alignment among them and does not affect the optical path length experienced by measurement beam 44 and information-carrying beam 124. The additional optical components that affect observation beam 66 and light pattern 70 (observation beam source 64, lens 109, beamsplitter 110, filter 71, and observation optics 72) are also fixed relative to the optical components that affect each of observation beam 66, information-carrying beam 124, measurement beam 44, and light pattern 70 (beam turner 49, lens 114, layer 122, and layer 27). As a result, movement of any one of them with arm 26 does not affect the optical path length experienced by those beams. Preferably the location of each of the optical components that affect measurement beam 44 and information-carrying beam 124 is fixed relative to arm 26 during normal operation, as is the location of each of the optical components that affect observation beam 66 and light pattern 70.

Lens mount 22 and probe tip mount 24 may be mounted at an adjustable angle $\phi$ with respect to an end 125 of arm 26. As described in connection with FIG. 5, lens mount 22 and probe tip mount 24 each have an orientation that is rotatable about an axis generally parallel to the path within them of measurement beam 44 and observation beam 66. Each of those adjustments is to be made, and the orientation of the affected components is to be fixed relative to other components (other than device 14) that affect the optical path experienced by measurement beam 44 and observation beam 66, before operating system 10 to measure electrical characteristics of device 14.

Figure 3:
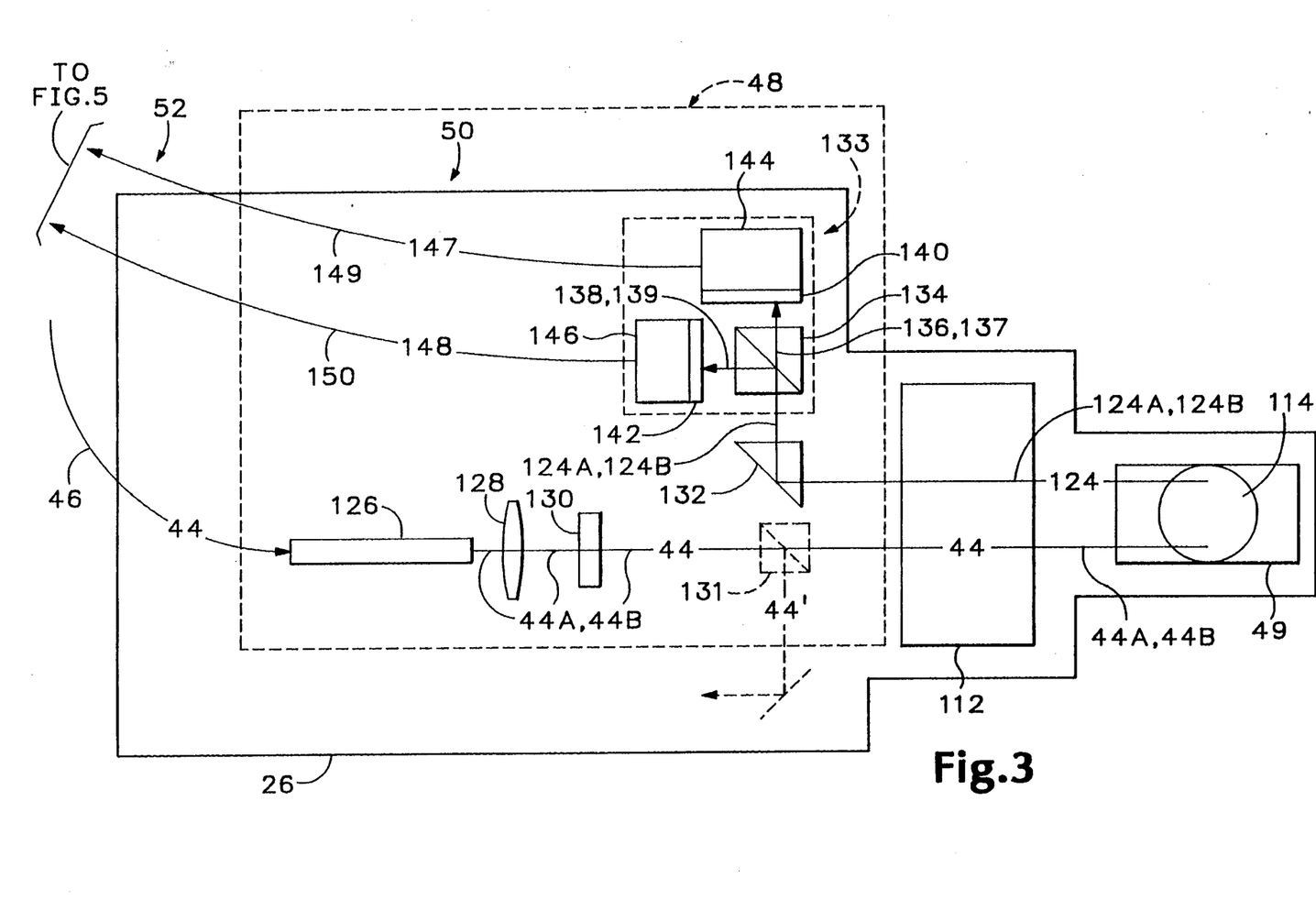
FIG. 3 is a partly schematic top view of the part of the electro-optic measurement system shown in FIG. 2, showing certain items omitted from FIG. 2 for clarity.

FIG. 3 is a partly schematic top view of part of system 10 showing certain components omitted from FIGS. 1 and 2 for clarity. One end of the flexible optical fiber which comprises measurement beam path 46 is polished and connected to a guide or standard fiber optic connector ferrule 126, which is in turn fixedly connected relative to probe arm 26. Such a ferrule is precisely manufactured so that the flexible optical fiber is mounted accurately and inexpensively. The position of one end of the flexible optical fiber is thus fixed relative to arm 26 and hence also relative to other optical components also fixed relative to arm 26. Measurement beam 44 is directed through lens 128, which is a simple aspheric lens (Corning 350080). Measurement beam 44 then passes through a bias adjustment device 130 (e.g., a waveplate) which allows control of the polarization state of measurement beam 44. Wave plate 130 sets the polarization state of measurement beam 44 for maximum sensitivity, and to compensate for polarization effects in the remainder of the optical path to layer 27. Beam 44 then proceeds as discussed in connection with FIG. 2. An optional beamsplitter 131 extracts a portion 44' of measurement beam 44 for possible uses described in the measurement system application.

Preferably wave plate 130 is adjusted, and/or the thickness s (FIG. 4) of electro-optic layer 27 is chosen, so that beam 44 is in a single polarization state (for convenience, a linear polarization state) when it reaches layer 27. Although in principle the adjustment can be carried out only by selecting the thickness s of layer 27, it is preferable to provide wave plate 130. The angle between the plane of polarization of beam 44 at layer 27 and the electro-optic axis 180 (FIG. 4) of layer 27 is preferably 45 degrees for maximum sensitivity of information-carrying beam 124 to electric fields in layer 27.

Lenses 128 and 114 are preferably Corning aspheric lenses designed for compact disk systems. Such lenses are small, inexpensive, and have high numerical apertures. The high numerical aperture determines the focused size of measurement beam 44 on layer 27 and also determines the separation of measurement beam 44 and information-carrying beam 124 above arm 26; a higher numerical aperture permits smaller spots and greater beam separations, both of which are desirable in electro-optic system 10.

With reference also to FIG. 4, measurement beam 44 traverses a first path segment 44A extending from guide 126 to layer 27 and having a first path segment location 44B relative to them.

Information-carrying beam 124 emerges from beam combiner 112 as discussed in connection with FIG. 2 and enters measurement optics 48, which includes a beam turner 132. Measurement optics 48 also includes a beam analysis unit 133, which includes a derivative beam generator or polarizing beamsplitter 134 that separates information-carrying beam 124 into first and second derivative beams 136 and 138 in respective linearly independent (as an example, orthogonal linear) polarization states and having respective intensity amplitudes. First and second derivative beams 136 and 138 travel in respective first and second derivative beam paths 137 and 139. Bias wave plate 130 and thickness s (FIG. 4) of layer 27 are preferably chosen so that, when beam 124 reaches beamsplitter 134, the power in beams 136 and 138 is equal when electro-optic layer 27 is experiencing no applied electric field. This occurs when beam 124 is in a circular polarization state. Such an optical bias adjustment is advantageous when differential detection (not shown) is used to analyze beams 136 and 138. When ratio detection (see FIGS. 5–6 of the measurement system application) is used, such an optical bias adjustment promotes linear operation of the system in determining the effect of electro-optic layer 27 on the optical characteristics of beams 44 and 124.

In a first preferred embodiment, beams 136 and 138 pass through respective filters 140 and 142, which substantially block any components of those beams at wavelengths other than those present in measurement beam 44. After passing filters 140 and 142 the remaining components of beams 136 and 138, respectively, impinge on respective first and second detection units or receivers 144 and 146, which may be optical-to-electrical converters such as photodiodes or phototransistors (as an example, United Detector Technology UDT 5DP converters). They in turn produce respective first and second electrical signals 147 and 148 from beams 136 and 138; signals 147 and 148 together comprise test signal 50. Signals 147 and 148 are carried on respective flexible signal paths or flexible electrical connectors 149 and 150 that together comprise test signal path 50. Test signal 50 thus comprises signals 147 and 148 indicative of the intensity of the components of information-carrying beam 124 in linearly independent or orthogonal polarization states.

Figure 3A:
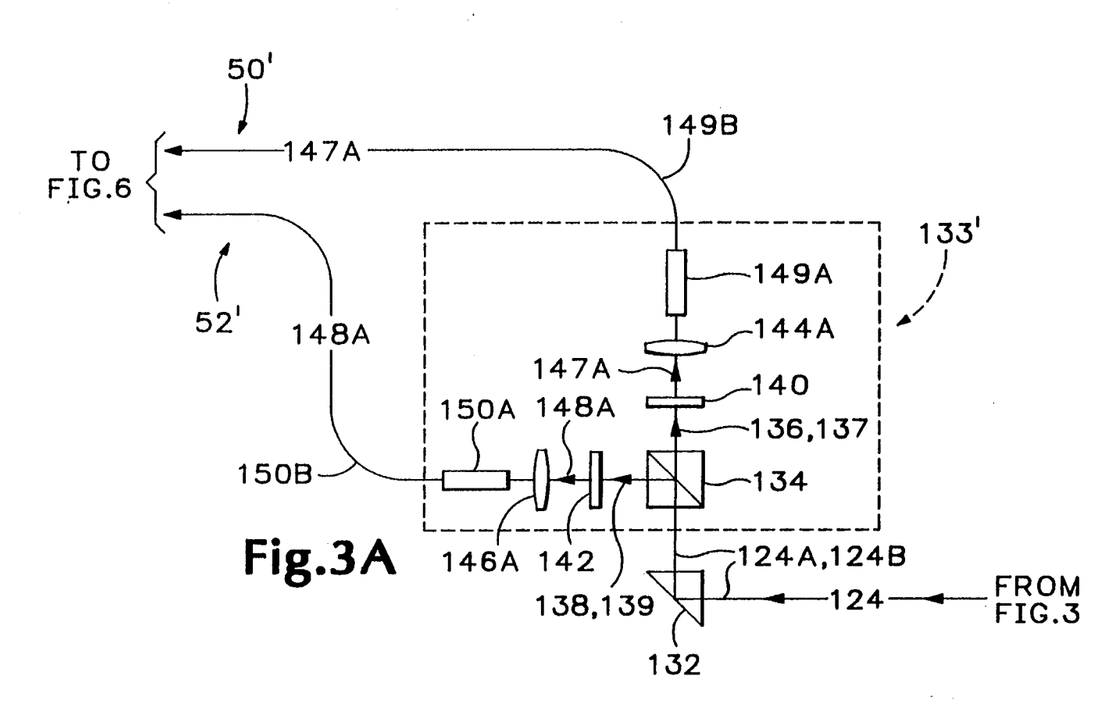
FIG. 3A is a schematic illustrating an alternative polarization analysis module used in a second preferred embodiment of the invention.

With reference also to FIGS. 3A and 4, information-carrying beam 124 traverses a second path segment 124A extending from layer 27 to beam analysis unit 133 or 133' and having a second path segment location 124B relative to them.

FIG. 3A is a schematic illustrating an alternative beam analysis unit 133 for analyzing beam 124 used in a second preferred embodiment of the invention. In FIG. 3A beams 136 and 138 (see FIG. 3) pass through respective filters 140 and 142. The remaining components of beams 136 and 138 then pass as beams 147A and 148A through respective lenses 144A and 146A, which direct those beams (through respective connector ferrules 149A and 150A) into flexible optical connectors 149B and 150B. Connectors 149B and 150B convey respective beams 147A and 148A to further analysis circuitry (shown in FIG. 6 of the measurement system application) not fixedly connected relative to probe arm 26 or optical components associated with test beam 44, measurement beam 66, light pattern 70, or information-carrying beam 124. The further analysis circuitry is preferably of the type described in FIG. 3, such as optical-to-electrical converters operative to receive respective beams 147A and 148A and to produce from them respective signals indicative of their intensity. Test signal 50' thus comprises beams 147A and 148A, and connector 52' thus comprises connectors 149B and 150B.

FIG. 4 is a partly schematic, simplified cross-sectional view of region 12, portion 68, layer 27, support layer 122, and lens 114, showing certain components omitted from FIGS. 1–3 for clarity. Support layer 122 supports layer 27 and is transparent to the wavelengths included in measurement beam 44 and observation beam 66. Layer 27 has a first surface 152 bonded to support layer 122 and a second surface 154 positioned between first surface 152 and device 14. Surface 156 is covered with a coating 156 that is highly reflective of measurement beam 44 but transmissive of observation beam 66. Measurement beam 44 accordingly reflects from surface 156 and (after being affected by the electro-optic material of layer 27 on a second transit of that layer) emerges from layer 27 as information-carrying beam 124. Measurement beam 44 is accordingly blocked from impinging on device 14 and thus from potentially affecting the electrical characteristics of device 14 during the measurement process. At least part of observation beam 66, however, passes through layer 27 and coating 156 and illuminates portion 68 of device 14. Rays 69 from that illumination pass through coating 156, layer 27, and support layer 122 to form light pattern 70. Layer 27 preferably has a thickness s of approximately 50 micrometers or less (thicknesses of approximately 27, 38, or 50 micrometers have been used); support layer 122 preferably has a thickness t of approximately 1.2 millimeters. Layer 27, support layer 122, and layer 156 together comprise probe tip 158.

Support layer 122 acts on beams 44, 66, 70, and 124 as a thin parallel plate and thus causes spherical aberration in any image formed from those beams. Lens 114 is of a design that corrects such spherical aberration. Lens 114 may be a commercially-available lens (Corning aspheric lens 350160) designed for use in compact disk systems. Compact disk lenses are manufactured with a correction for the spherical aberration caused by the thin parallel plate of a standard compact disk, that is, the spherical aberration due to a 1.2-millimeter-thick plate with an index of refraction of 1.57. That correction is adequate for support layer 122 if support layer 122 is glass with a thickness s of 1.2 millimeters and if wavelengths are used for beams 44 and 66 for which the index of refraction of support layer 122 is in the range of typical glasses. The spherical aberration caused by thin parallel glass plates of a given thickness is substantially independent of the index of refraction of the glass for indices of refraction of ordinary glasses. When measurement beam 44 is preferably produced by a laser used in measurement beam source 42, measurement beam 44 has a very narrow wavelength range (typically a few Angstroms). Observation beam 66 also preferably has a range of wavelengths that is sufficiently narrow to eliminate any need to consider chromatic aberration relating to observation beam 66 when designing system 10. When observation beam source 64 is a light-emitting diode, the range of wavelengths of observation beam 66 is typically 30–60 nanometers, which is narrow enough to meet that goal for most systems 10. Chromatic aberration of measurement beam 44 and information-carrying beam 124 due to support layer 122 may thus be disregarded. Moreover, layer 27, because of its thinness relative to support layer 122, does not cause significant aberrations, and thus it may be disregarded for purposes of adjusting for aberrational effects.

Figure 5:
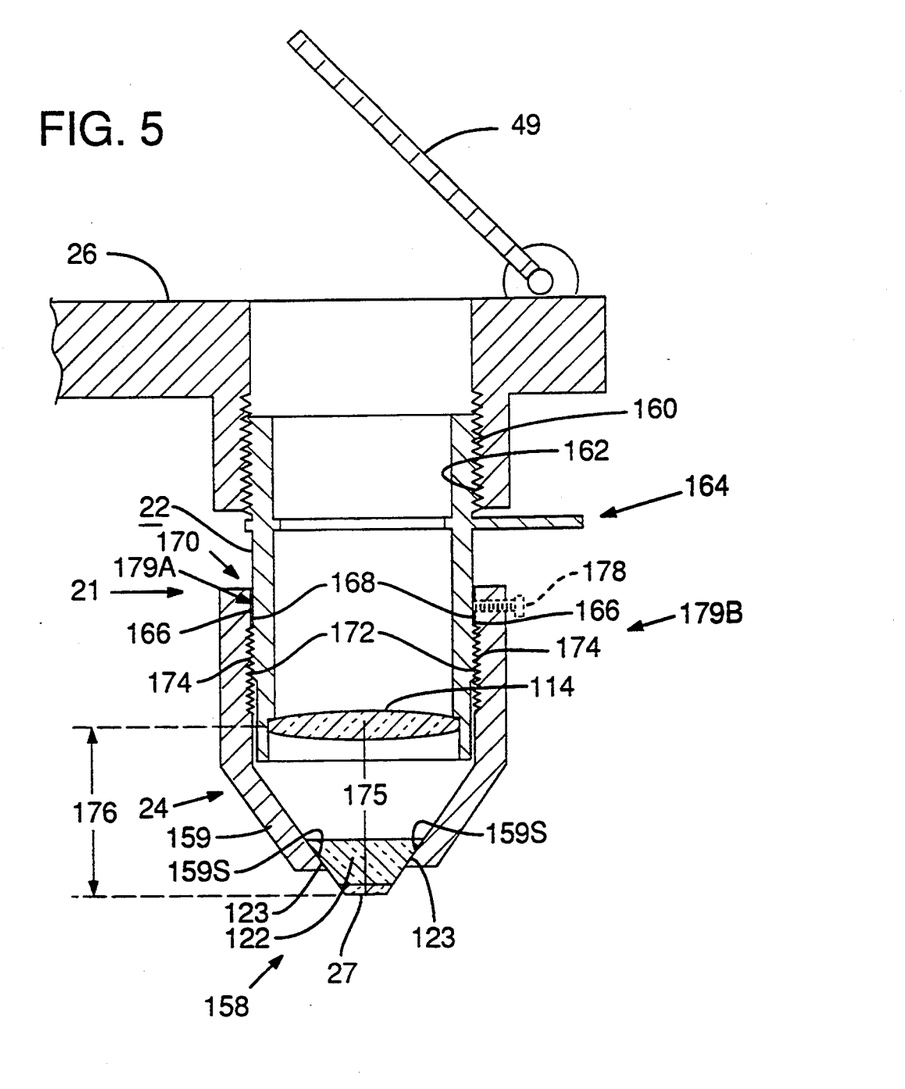
FIG. 5 is a cross-sectional view of the probe tip, a probe tip mount base, the lens, and the lens mount showing first and second preferred embodiments of the invention.

If a glass or other material having an index of refraction much higher or lower than the index of refraction of typical glasses is used for support layer 122, the thickness t should preferably be chosen so that, given the index of refraction of support layer 122 for the wavelengths of beams 44 and 66, a compact disk lens used as lens 114 corrects for the spherical aberration introduced by support layer 122. This may be done by using the top formula on p. 84 of Warren J. Smith, *Modern Optical Engineering* (McGraw-Hill Book Co., New York, 1966) to choose thickness t. That formula is:

$$\text{Spherical Aberration} = \frac{t}{N}\left[1 - \frac{N\cos U}{(N^2 - \sin^2 U)^{\frac{1}{2}}}\right] \text{(exact)}$$

$$= \frac{tu^2(N^2 - 1)}{2N^3} \text{ (third order)},$$

where t is the thickness to be calculated, N is the index of refraction of support material 122, U and u are the slope angle of a ray forming part of the foregoing beams to the optic axis of layer 27 and lens 114 (i.e., to path 175 of FIG. 5), and the spherical aberration is that which lens 144 is designed to correct. Alternatively, lens 114 is manufactured to correct for the spherical aberration caused by support layer 122 of predetermined index of refraction and thickness t; but use of a compact disk lens as lens 114 is likely to prove more economical. Layer 27 has an electro-optic axis 180 which is adjustable as discussed in connection with FIG. 5.

FIG. 5 is a cross-sectional view of lens mount 22 and probe tip mount 24 mounted on arm 26 near beam turner 49. Probe tip mount 24 includes probe tip 158 and a probe tip mount base 159, which has a probe tip mount base support surface 159S. Support layer 122 has a mounting surface 123 that is supported by support surface 159S. Lens mount 22, probe tip mount 24, support layer 122, and layer 27 each have a circular cross-section in a plane (not shown) generally perpendicular to the path of measurement beam 44 and observation beam 66.

Lens mount 22 is secured to arm 26 by threads 160 which match with threads 162 fixedly supported relative to or formed in arm 26. Threads 160 and 162 allow rotation of lens mount 22 relative to arm 26 about an axis generally parallel to the path of the path of measurement beam 44 and observation beam 66. A handle 164 attached to lens mount 22 allows the user easily to accomplish that rotation. Threads 160 and 162 may be of a character that facilitates attachment of lens mount 22 to arm 26 parallel to the path of measurement beam 44 and observation beam 66; they may also be of a character that retains lens mount 22 on arm 26 and permits relative rotation of lens mount 22 without movement of lens mount 22 parallel to the path.

Lens mount 22 has a lens alignment surface 166, such as the exterior surface of a lens tube defining lens mount 22, that matches a probe alignment surface 168 on probe tip mount 24, such as the interior surface of a tube defining the upper part of probe tip mount 24. Surfaces 166 and 168 cooperate to facilitate alignment of layer 27 relative to lens 114 and are formed so as to have as small a clearance 170 as possible between them so as to preserve proper centration of layer 27 relative to lens 114 so that a path 175 for beams 44 and 66 leads from lens 114 to layer 27. Surfaces 166 and 168 accordingly allow slidable adjustment of probe tip mount 24 relative to lens mount 22 and thus also relative to arm 26.

Probe tip mount 24 is secured to lens mount 22 in either or both of two ways. In a first preferred embodiment probe tip mount 24 may have formed in it threads 172 that engage threads 174 formed in lens mount 22. Relative rotation of probe tip mount 24 and lens mount 22 adjusts the distance 176 that reflects the length of path 175 and is the distance between second surface 154 and lens 114. The relative position of probe tip mount 24 relative to lens mount 22 may be firmly held by (optional) set screw 178 extending through probe tip mount 24 to make a pressure contact with lens mount 22. Alternatively, threads 172 and 174 are dispensed with, and in a second preferred embodiment set screw 178 is provided and tightened against lens mount 22 to secure the relative position of probe tip mount 24 and lens mount 22, thus fixing their relative rotational position and distance 176. In either alternative, threads 160 and 162 allow for joint rotation of probe tip mount 24 and lens mount 22, when their position relative to each other is fixed, to adjust the orientation of layer 27 and thus of its electro-optic axis 180 (FIG. 4). If threads 160 and 162 provide for relative movement of lens mount 22 and arm 26 generally parallel to the path of beams 44 and 66, further adjustment of the relative position of lens mount 22 and probe tip mount 24 may be necessary if lens mount 22 is rotated relative to arm 26. Surfaces 166 and 168 define an alignment structure 179A for aligning layer 27 with path 175. Threads 172 and 174, and/or set screw 178 and surfaces 166 and 168, define an adjustment structure 197B for adjusting distance 176.

Materials of which layer 27 is formed have an optical response or electro-optic axis along which their optical response is particularly strong. Layer 27 may be formed with that axis either parallel to surface 156 (axis 180 of FIG. 4) or perpendicular to it (not shown). When axis 180 is parallel to surface 156, it is often advantageous in measuring electrical characteristics of device 14 to be able to orient axis 180 relative to electric fields produced by device 14 to provide the strongest electro-optic effect. By adjusting the orientation of probe tip mount 24 relative to the device under test, the orientation of axis 180 can be changed. If such rotation of probe tip mount 24 changes distance 176 or the respective distances between layer 27 and lens 114 and beam turner 49, it may be necessary to readjust distance 176 to preserve proper focus.

If threads 172 and 174 are provided, they are preferably of a character that allows fine adjustment of distance 176 but provides a relatively loose fit. Because threads are typically less precise than formed surfaces, primary reliance is placed on surfaces 166 and 168, rather than on threads 172 and 174, to assure proper centration and alignment of layer 27 relative to lens 114.

Figure 6:
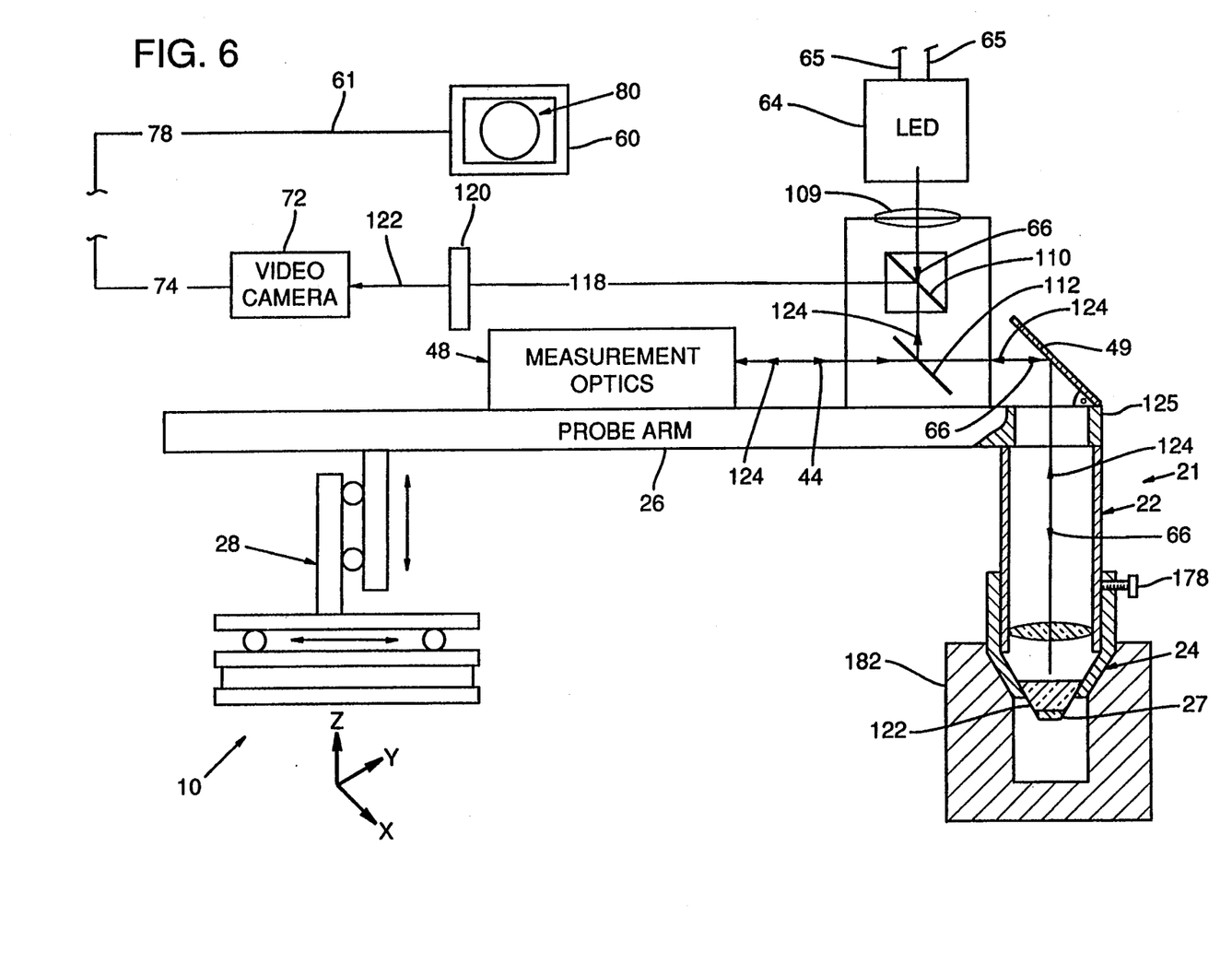
FIG. 6 is a partly schematic view of part of the electro-optic measurement system of FIG. 1 and illustrates a way of adjusting the position of the probe tip relative to the lens.

FIG. 6 is a partly schematic and partly cross-sectional view of certain components of system 10 and illustrates a process for focusing light pattern 70 and correspondingly measurement beam 44 on layer 27 when threads 172 and 174 (FIG. 5) are dispensed with and the relative position of lens mount 22 and probe tip mount 24 is fixed by set screw 178. Probe tip mount 24 is held in a container 180 such as part of a protective shipping and/or storage container. Surfaces 166 and 168 (FIG. 5) are placed in alignment such as by placing container 180 on a stage (not shown) which normally holds device 14. User 41 views display image 80 on display 60 (see FIG. 1) while actuating positioner 28 to move arm 26, and hence also lens mount 22 attached to arm 26, in a direction (such as vertical) that varies distance 176 (see FIG. 5). When layer 27 comes into focus in display image 80, the user makes any necessary fine adjustment to focus display image on a desired level of layer 27 such as reflective coating 156. When the desired focus is achieved, the user tightens set screw 178 to secure probe tip mount 24 relative to lens mount 22.

System 10 is also applicable to measure characteristics of device 14 other than electrical characteristics. System 10 operates as described because of the change in the (complex) index of refraction of layer 27 when layer 27 experiences an electric field. Layer 27 responds to measurement beam 44 by imparting information that is contained in information-carrying beam 124. Layer 27 imparts that information because its complex refractive index changes in response to characteristics of device 14. It is well known that the propagation of plane waves in a medium follows the expression $$E = E_0 exp^{i2\pi vt} exp^{[(-i2\pi x/c)(n-ik)]},$$

where $n' = n - ik$ is the complex refractive index that includes not only phase change caused by the real term n but also attenuation caused by the $-ik$ term. As discussed in greater detail in the measurement system application, system 10 can be sensitive to both phase change and attenuation imparted by layer 27.

A variety of materials are known which experience a change in refractive index as a result of a change in a parameter to which the material is subject. Electro-optic materials experience a change in refractive index with a change in the electric field to which they are subject. Electro-optic materials may also be used to measure changes in magnetic characteristics by detecting changes in electrical characteristics associated with changes in magnetic characteristics by way of relationships set forth in Maxwell's equations. Other materials are known which experience a change in refractive index with a change in the magnetic field to which they are subject. Such magneto-optic materials can be used to form layer 27' (not separately shown) and used with system 10 to measure magnetic characteristics directly. Pyroelectric materials experience a change in refractive index with a change in their temperature. Thus, as illustrated above with respect to electro-optic materials, a magneto-optic or pyroelectric material can be used to form a layer 27' or 27" (not separately shown) mounted in a probe tip and lens mount assembly 21 and used with system 10 to measure magnetic or thermal characteristics, respectively, of a device under test 14. A system 10 using such a layer 27' or 27" employs the micropositioning features of positioner 28 and controller 34 to place layer 27' or 27" at a desired, reproducible distance from, or in nondestructive contact with, region 14.

Such use of a pyroelectric material as a layer 27" allows system 10 to measure thermal characteristics of a region 12 in a way that is of value in the contemporary environment of concern with heat generation in and heat dissipation from ever-more-highly-integrated microprocessors and other circuits. As an example, thermal characteristics of a region 12 may indicate that a circuit element formed in device 14 is defective or may indicate that such a circuit element is malfunctioning because of improper temperature even though it is not itself defective.

Examples of materials that exhibit a pyroelectric effect, and which thus may be used as layer 27", are lithium tantalate and lithium niobate. Because such materials also exhibit an electro-optic effect, it is important when using them to appropriately separate the effect (that is, electric or thermal) to which the change in their refractive index responds.

It will be apparent to skilled persons that many changes may be made to details of the specific embodiments of the invention described herein without departing from the underlying principles thereof. The scope of the invention should, therefore, be determined only by the following claims.

We claim:

1. A moveable optical module in an optically based system for measuring a physical characteristic of a selected region of a device under test with the use of a measurement beam, comprising:
    a guide for the measurement beam;
    a material that is in optical communication with the guide, that undergoes a change in refractive index in response to the physical characteristic, and that is operable to produce from the measurement beam an information-carrying beam having an optical characteristic indicative of the physical characteristic;
    a beam direction unit operable to direct the measurement beam onto the material;
    a beam analysis unit operable to receive the information-carrying beam and to produce therefrom a test signal indicative of the optical characteristic and from which information about the physical characteristic may be derived; and
    a mechanically rigid mounting structure moveable relative to the device under test,
    the measurement beam traversing a first path segment extending from the guide to the material and having a first path segment location relative to them,
    and the information-carrying beam traversing a second path segment extending from the material to the beam analysis unit and having a second path segment location relative to them,
    the guide, the material, the beam direction unit, and the beam analysis unit mounted to the mounting structure so that movement of the mounting structure relative to the device under test does not change the first or the second path segment location and does not change relative alignment of the guide, the material, the beam direction unit, and the beam analysis unit.

2. The moveable optical module of claim 1, wherein the beam direction unit comprises a lens operable to direct the measurement beam toward the material.

3. The moveable optical module of claim 2, wherein the lens is further operable to direct the information-carrying beam toward the beam analysis unit.

4. The moveable optical module of claim 1, wherein the optical characteristic comprises the intensity of a polarization state of the information-carrying beam.

5. The moveable optical module of claim 1, wherein the optical characteristic comprises the relation between the intensities of two linearly independent polarization states of the information-carrying beam.

6. The moveable optical module of claim 1, wherein the material comprises an electro-optic material.

7. The moveable optical module of claim 1, wherein the material comprises a pyroelectric material.

8. The moveable optical module of claim 1, further comprising:
    a measurement beam source operable to produce the measurement beam; and
    a flexible connector having first and second ends, the flexible connector receiving the measurement beam from the measurement beam source at the first end and transmitting the measurement beam from the second end, and wherein:
    the guide mounts the second end of the flexible connector to the mounting structure and couples the measurement beam to the material so that movement of the mounting structure does not change the first or second path segments.

9. The moveable optical module of claim 1, wherein the flexible connector comprises an optical fiber.

10. The moveable optical module of claim 9, wherein:
    the optical fiber is of a polarization-stripping type that passes only a predetermined polarization state; and
    the measurement beam is in the predetermined polarization state.

11. The moveable optical module of claim 9, wherein the optical fiber is of a polarization-preserving type.

12. The moveable optical module of claim 1, wherein the measurement beam is in a linear polarization state when it reaches the material.

13. The moveable optical module of claim 1, wherein:
    the information-carrying beam includes first and second linearly independent polarization states; and
    the beam analysis unit comprises:
    a beam divider operable to receive the information-carrying beam and to produce from the linearly independent polarization states respective first and second derivative beams travelling in respective first and second derivative beam paths, and
    first and second detection units for producing respective first and second electrical signals indicative of the intensity of the respective first and second derivative beams, the beam divider and the first and second detection units mounted to the mounting structure so that movement of the mounting structure relative to the device under test does not change the location of any of the second path segment and the derivative beam paths relative to any one of the first and second detection units.

14. The moveable optical module of claim 13, wherein the information-carrying beam is in a circular polarization state when it is received by the beam divider when the material is not detecting the physical characteristic.

15. The moveable optical module of claim 1, wherein:
the information-carrying beam includes first and second linearly independent polarization states; and
the beam analysis unit comprises:
a beam divider operable to receive the information-carrying beam and to produce from the linearly independent polarization states respective first and second derivative beams travelling in respective first and second derivative beam paths;
first and second optical fibers, each having first and second ends, each optical fiber operable to receive a respective one of the first and second derivative beams and to convey it as part of the test signal to a respective one of first and second beam detection units; and
first and second connectors, each mounting the first end of a respective one of the first and second optical fibers to the mounting structure so as to couple a respective one of the derivative beams to a respective one of the fibers so that movement of the mounting structure does not change the location of any one of the derivative beam paths relative to any one of the connectors or the coupling of each derivative beam to its respective fiber.

16. The moveable optical module of claim 1, wherein the material is in the form of a layer having a principal surface, and the beam direction unit is operable to direct the measurement beam into the material and onto the principal surface.

17. The moveable optical module of claim 16, wherein the material is operable to produce the information-carrying beam through reflection of the measurement beam at the principal surface.

18. A moveable optical module in an optically based system for measuring a physical characteristic of a selected region of a device under test with the use of a measurement beam and with the use of an observation beam that does not significantly affect the physical characteristic, comprising:
a guide for the measurement beam;
a material that is in optical communication with the guide, that undergoes a change in refractive index in response to the physical characteristic, and that is operable to produce from the measurement beam an information-carrying beam having an optical characteristic indicative of the physical characteristic, the material transparent to the observation beam;
a beam direction unit operable to direct the measurement beam onto the material, to direct the observation beam through the material and onto the device under test, and to form a light pattern containing information representative of the device under test;
a beam analysis unit operable to receive the information-carrying beam and to produce therefrom a test signal indicative of the optical characteristic and from which information about the physical characteristic may be derived;
observation optics operable to receive the light pattern and to produce therefrom a signal containing the information representative of the device under test; and
a mechanically rigid mounting structure moveable relative to the device under test,
the measurement beam traversing a first path segment extending from the guide to the material and having a first path segment location relative to them, and the information-carrying beam traversing a second path segment extending from the material to the beam analysis unit and having a second path segment location relative to them,
the guide, the material, the beam direction unit, and the beam analysis unit mounted to the mounting structure so that movement of the mounting structure relative to the device under test does not change the first or the second path segment location and does not change relative alignment of the guide, the material, the beam direction unit, and the beam analysis unit.

19. The moveable optical module of claim 18, wherein:
the light pattern traverses a light pattern path segment from the beam direction unit to the observation optics and has a light pattern path segment location relative to them; and
the guide, the material, the beam direction unit, the beam analysis unit, and the observation optics are mounted to the mounting structure so that movement of the mounting structure relative to the device under test does not change the first, the second, or the light pattern path segment location and does not change relative alignment of, the guide, the material, the beam direction unit, the beam analysis unit, and the observation optics.

20. The moveable optical module of claim 18, wherein the beam direction unit comprises a lens operable to direct the measurement beam toward the material and the observation beam toward the device under test.

21. The moveable optical module of claim 20, wherein the lens is further operable to direct the information-carrying beam toward the beam analysis unit and the light pattern toward the observation optics.

22. The moveable optical module of claim 18, wherein the measurement and observation beams are of different wavelengths.

23. The moveable optical module of claim 18, wherein the material is in the form of a layer having a principal surface, and the beam direction unit is operable to direct the measurement beam into the material and onto the principal surface and to direct the observation beam through the layer and onto the region.

24. The moveable optical module of claim 19, further comprising:
a reflective surface that is fixedly connected relative to the principal surface, that is reflective of the measurement beam, and that is transmissive of the observation beam; and wherein:
the beam direction unit is further operable to direct the observation beam through the material and the reflective surface and onto the region.

* * * * *